United States Patent
Abuellil et al.

(10) Patent No.: US 11,405,041 B2
(45) Date of Patent: Aug. 2, 2022

(54) PROGRAMMABLE FREQUENCY DLL

(71) Applicant: SHENZHEN GOODIX TECHNOLOGY CO., LTD., Shenzhen (CN)

(72) Inventors: Amr Abuellil, San Diego, CA (US); Ahmed Emira, San Diego, CA (US); Janakan Sivasubramaniam, San Diego, CA (US)

(73) Assignee: Shenzhen Goodix Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/176,164

(22) Filed: Feb. 15, 2021

(65) Prior Publication Data
US 2021/0250031 A1    Aug. 12, 2021

Related U.S. Application Data

(63) Continuation-in-part of application No. 16/788,284, filed on Feb. 11, 2020, now Pat. No. 10,924,121.

(51) Int. Cl.
*H03K 5/14*     (2014.01)
*H03L 7/081*    (2006.01)

(52) U.S. Cl.
CPC .................................. *H03L 7/0814* (2013.01)

(58) Field of Classification Search
CPC ..... H03L 7/099; H03L 2207/50; H03L 7/085; H03L 7/0995; H03L 7/0992; H03L 7/08; H03L 7/089; H03L 7/18; H03L 7/0812; H03L 7/23; H03L 7/00; H03L 7/06; H03L 7/185; H03L 7/22; H03L 7/097; H03L 7/10; H03K 2005/00156; H03K 5/086; H03C 3/0908
USPC ....... 327/144, 146, 147, 149, 152, 153, 156, 327/158, 161, 162, 163
See application file for complete search history.

(56) References Cited

U.S. PATENT DOCUMENTS

| 6,182,236 B1 * | 1/2001 | Culley ...................... G06F 1/10 327/149 |
| 7,733,138 B2 | 6/2010 | Uehara et al. |
| 10,924,121 B1 * | 2/2021 | Abuellil ................ H03L 7/0814 |

* cited by examiner

*Primary Examiner* — Hai L Nguyen
(74) *Attorney, Agent, or Firm* — Kilpatrick Townsend & Stockton LLP

(57) ABSTRACT

A DLL circuit that has a programmable output frequency is provided. In various embodiments, the DLL circuit comprises an input configured to receive an input clock defining an input clock period; an output configured to provide a DLL output clock; a delay line configured to receive the input clock, wherein the delay line comprises a plurality of delay stages, each configured to generate one of a plurality of delay line output clocks, each of the delay line output clocks having a phase relative to the input clock based on a delay of the delay line; a clock generation circuit, configured to generate the DLL output clock based on a selected plurality of the delay line output clocks; and a control circuit configured to select which of the delay line output clocks the clock generation circuit uses to generate the DLL output clock.

16 Claims, 5 Drawing Sheets

PROGRAMMABLE FREQUENCY DLL

CROSS-REFERENCE TO RELATED APPLICATIONS

This application is a continuation in part of U.S. patent application Ser. No. 16/788,284, for "NO FALSE LOCK DLL" filed on Feb. 11, 2020, U.S. Pat. No. 10,924,121, issued on Feb. 16, 2021, which is hereby incorporated by reference in its entirety.

FIELD OF THE INVENTION

The present application generally pertains to Digital Locked Loops (DLLs), and more particularly to DLLs having improved mechanisms for locking.

BACKGROUND OF THE INVENTION

DLLs produce an output frequency based on an input clock, for example, generated based on a crystal oscillator. The acquisition process of generating the appropriate output frequency is conventionally slow, so to provide multiple frequency output options, multiple DLLs or multiple delay lines are used. Improvements in DLL architecture are needed in the art.

BRIEF SUMMARY OF THE INVENTION

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. One general aspect includes a DLL circuit. The DLL circuit also includes an input configured to receive an input clock defining an input clock period. The DLL circuit also includes an output configured to provide a DLL output clock. The DLL circuit also includes a delay line configured to receive the input clock, where the delay line includes a plurality of delay stages, each configured to generate one of a plurality of delay line output clocks, each of the delay line output clocks having a phase relative to the input clock based on a delay of the delay line. The DLL circuit also includes a clock generation circuit, configured to generate the DLL output clock based on a selected plurality of the delay line output clocks. The DLL circuit also includes a control circuit configured to select which of the delay line output clocks the clock generation circuit uses to generate the DLL output clock. Other embodiments of this aspect include corresponding computer systems, apparatus, and computer programs recorded on one or more computer storage devices, each configured to perform the actions of the methods.

Implementations may include one or more of the following features. The DLL circuit where the control circuit is configured to change which of the delay line output clocks the clock generation circuit uses to generate the DLL output clock. Changing which of the delay line output clocks the clock generation circuit uses to generate the DLL output clock, causes a frequency of the DLL output clock to change. The control circuit is configured to change the delay of the delay line so as to cause a phase difference between the input clock and a sensed delay line output clock to be substantially equal to the period of the input clock. The control circuit is configured to change which of the delay line output clocks is sensed. The clock generation circuit is configured to generate the DLL output clock based on the input clock, the sensed delay line output clock, and any other delay line output clocks having phase differences relative to the input clock which are less than the sensed delay line output clock. The delay line includes n delay stages generating n delay line output clocks, where n is an integer, where a first delay stage through an nth delay stage are sequentially connected in series, and where the control circuit is configured to select any of the nth delay line output clock and at least one other delay line output clock as the sensed delay line output clock. The control circuit is configured to select a particular delay line output clock as the sensed delay line output clock and to power down delay stages generating outputs clocks having phase differences relative to the input clock which are greater than the phase difference of the selected particular delay line output clock. Implementations of the described techniques may include hardware, a method or process, or computer software on a computer-accessible medium.

DETAILED DESCRIPTION OF THE INVENTION

Particular embodiments of the invention are illustrated herein in conjunction with the drawings.

Various details are set forth herein as they relate to certain embodiments. However, the invention can also be implemented in ways which are different from those described herein. Modifications can be made to the discussed embodiments by those skilled in the art without departing from the invention. Therefore, the invention is not limited to particular embodiments disclosed herein.

The embodiments discussed herein relate to a DLL circuit that has a programmable output frequency. The DLL circuit uses an edge combiner that presents a load to each of the delay line output clocks, where the loads for the delay line output clocks are matched.

Figure 1:
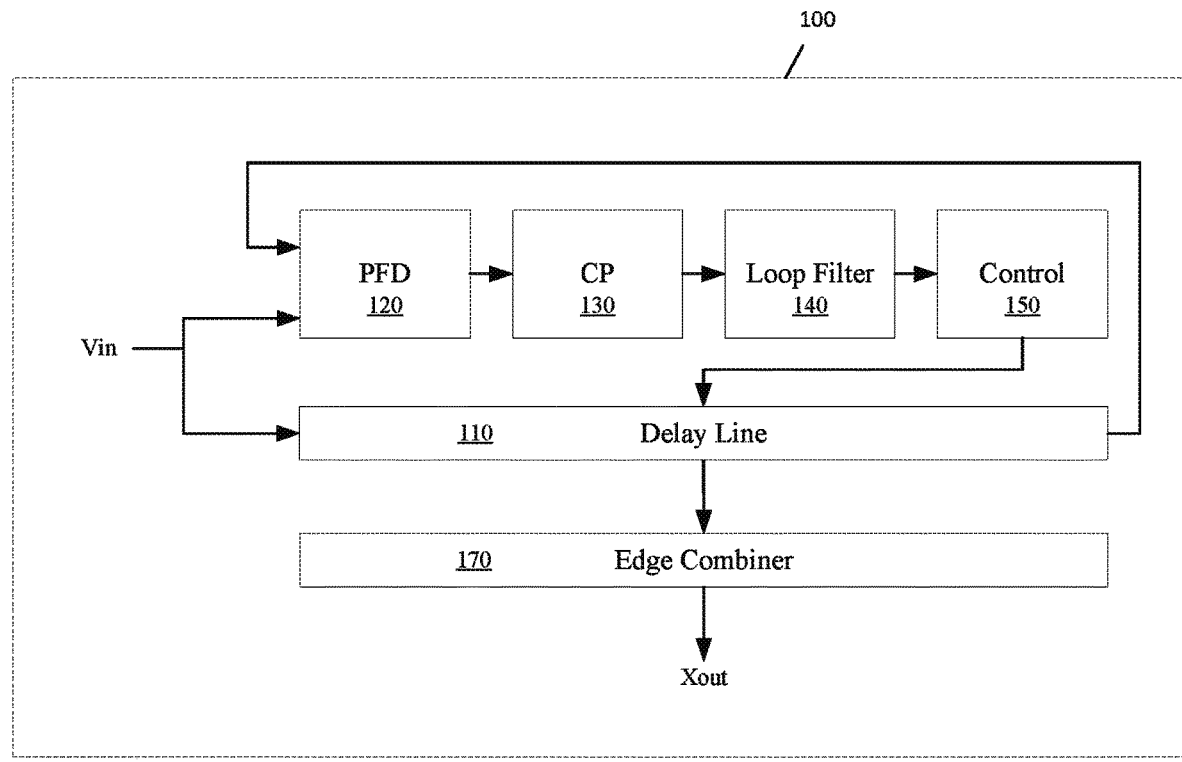
FIG. 1 is a schematic diagram illustrating a conventional DLL circuit.

FIG. 1 is a schematic diagram illustrating a conventional DLL circuit 100. DLL circuit 100 includes delay line 110, phase frequency detector (PFD) 120, charge pump (CP) 130, loop filter 140, control circuit 150, and edge combiner 170.

Delay line 110 is configured to receive an input or reference clock at node Vin. The input clock has a particular input frequency, generated, for example, by a crystal oscillator. Delay line 110 has multiple delay stages which collectively delay the input clock signal by a delay amount equal to the sum of the delays of each of the delay stages.

The delayed input clock signal and the undelayed input clock are provided to PFD 120. PFD 120 generates a series of signals, each indicating a time difference between particular edges of the delayed input clock signal and the undelayed input clock.

The series of signals generated by the PFD 120 are provided to charge pump 130. In response to the series of signals, charge pump 130 generates corresponding pulses for loop filter 140. The pulses generated by charge pump 130 for loop filter 140 cause an analog loop filter voltage to change.

Control circuit 150 influences the delay of each of the delay stages of the delay line 110 based on the analog loop filter voltage of loop filter 140.

As understood by those of skill in the art, delay line 110, PFD 120, charge pump 130, loop filter 140, and control circuit 150 collectively form a feedback loop which functions to align the phase and frequency of the input clock signal and the output signal of the delay line 110.

As understood by those of skill in the art, in some embodiments, a divide block (not shown) is placed between the output of the delay line 110 and the input of PFD 120. In such embodiments, delay line 110, PFD 120, charge pump 130, loop filter 140, and control circuit 150 collectively form a feedback loop which functions to align the phase and frequency of the input clock signal and the divided output signal of the delay line 110. In such embodiments, the output signal of the delay line has a frequency which is substantially equal to the frequency of the input clock signal times the division factor of the divide block.

Edge combiner 170 receives output signals from a number of the delay stages of the delay line 110, each received output signal corresponding with a different phase of the delayed clock. Edge combiner 170 is configured to generate an output clock based on the received phases. Any of a number of conventional edge combiner circuits performing this function may be used.

As understood by those of skill in the art, the architecture of DLL circuit 100 is subject to a false lock condition. As described above, it is desirable for the feedback of DLL circuit 100 to cause alignment of the phase and frequency of the input clock signal and the output signal of the delay line 110. When in a false lock condition, the feedback loop of DLL circuit 100 may cause alignment of the phase and frequency of the input clock signal and the output of the delay line 100 divided by or multiplied by an integer. For example, the feedback of DLL circuit 100 may cause alignment of the phase and frequency of the input clock signal and the output signal of the delay line 110, where the frequency of the output signal of the delay line 110 is two or more times the frequency of the input clock signal. Similarly, the feedback of DLL circuit 100 may cause alignment of the phase and frequency of the input clock signal and the output signal of the delay line 110, where the frequency of the output signal of the delay line 110 is one half or another integer fraction of the frequency of the input clock signal.

Conventional DLL circuits include a false lock detect circuit, which detects false lock conditions, and corrections circuitry which addresses the false lock condition.

Figure 2:
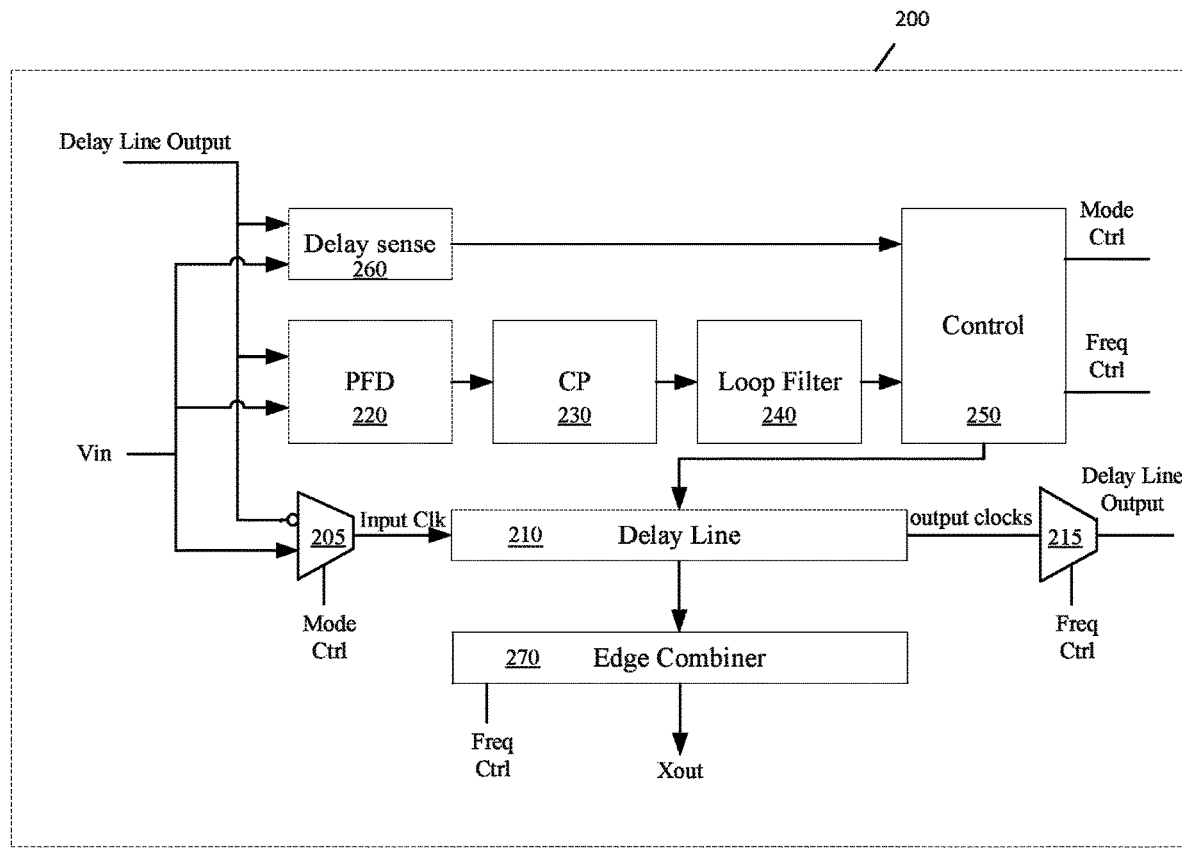
FIG. 2 is a schematic diagram illustrating a non-conventional DLL circuit.

FIG. 2 is a schematic diagram illustrating a non-conventional DLL circuit 200. DLL circuit 200 includes multiplexor 205, delay line 210, multiplexor 215, phase frequency detector (PFD) 220, charge pump (CP) 230, loop filter 240, control circuit 250, delay sense circuit 260, and edge combiner 270.

Delay line 210 is configured to selectively receive an input clock from node Vin. The input clock has a particular input frequency, generated, for example, by a crystal oscillator. Delay line 210 has multiple delay stages which collectively delay the input clock signal by a delay amount equal to the sum of the delays of each of the delay stages.

Multiplexor 215 receives a plurality of output clocks generated by the delay stages. According to a control signal Freq Ctrl provided by controller 250, multiplexor 215 provides a selected one of the received output clocks as the delay line output clock signal.

The delay line output clock signal and the undelayed input clock are provided to PFD 220. PFD 220 generates a series of signals, each indicating a time difference between particular edges of the delay line output clock signal and the undelayed input clock.

The series of signals generated by the PFD 220 are provided to charge pump 230. In response to the series of signals, charge pump 230 generates corresponding pulses for loop filter 240. The pulses generated by charge pump 230 for loop filter 240 cause an analog loop filter voltage to change.

Control circuit 250 influences the delay of each of the delay stages of the delay line 210 based on the analog loop filter voltage of loop filter 240.

As understood by those of skill in the art, delay line 210, PFD 220, charge pump 230, loop filter 240, and control circuit 250 collectively form a feedback loop which functions to align the phase and frequency of the input clock signal and the delay line output signal from multiplexor 215.

As understood by those of skill in the art, in some embodiments, a divide block (not shown) is placed between the output of the multiplexor 215 and the input of PFD 220. In such embodiments, delay line 210, PFD 220, charge pump 230, loop filter 240, and control circuit 250 collectively form a feedback loop which functions to align the phase and frequency of the input clock signal and the divided delay line output signal from multiplexor 215. In such embodiments, the output signal of the delay line has a frequency which is substantially equal to the frequency of the input clock signal times the division factor of the divide block. For purposes of this application, in embodiments using a divide block, the output of the divide block is referenced as the output of the multiplexor 215.

Edge combiner 270 receives input and output signals from a number of the delay stages of the delay line 210, each received output signal corresponding with a different phase of the delayed clock. Edge combiner 270 is configured to generate an output clock at output node Xout based on the received phases. For example, edge combiner 270 may receive input and output signals from each of five delay stages, and generate an output clock at output node Xout based on the input and output signals. For example, edge combiner 270 may be configured to generate a clock having a frequency five times the frequency of the input clock signal based on the input and output signals from each of the five delay stages. Similarly, edge combiner 270 may be configured to generate a clock having a frequency three or seven or another number times the frequency of the input clock signal based on the input and output signals from each of three or seven delay stages. Any of a number of conventional edge combiner circuits performing this function may be used.

The architecture of DLL circuit 200 locks quickly and is not subject to a false lock condition.

In response to the at least one of the phase and frequency of the delay line 210 being different from the input clock by an amount greater than a threshold, control circuit 250 causes the DLL circuit 200 to operate in a lock assist mode. Once the lock assist mode causes the at least one of the phase and frequency of the delay line 210 being different from the input clock by an amount less than the threshold, or less than another threshold (for example for hysteresis), the control circuit 250 causes the DLL circuit 200 to operate in a normal operating mode.

During the lock assist mode, the DLL circuit 200 is configured to program the delay line with a delay value approximately equal to the delay value for locked normal operation. Once the delay value of the delay line 210 is approximately equal to the delay value for normal operation, the DLL circuit 200 exits lock assist mode, and enters the normal operating mode, where the DLL feedback loop is used to modify the delay line output signal such that its phase and frequency are approximately equal to that of the input clock signal.

During the lock assist mode, instead of receiving its input from the input clock at node Vin, the delay line 210 receives its input from the output of the multiplexor 215, as controlled by multiplexor 205 based on the Mode Ctrl signal from controller 250. Therefore, during the lock assist mode, the delay line 210 does not receive input from and does not respond to the input clock at node Vin. Instead, because the inverted output of the multiplexor 215 is connected to the input of the delay line 210, the delay line 210 acts as a ring oscillator while in the lock assist mode.

In some embodiments, the desired condition for completion of the lock assist mode is that the delay of delay line 210 causes the ring oscillator to oscillate at a frequency approximately half the frequency of the input clock signal. As understood by those of skill in the art, this corresponds with the condition that the delay of delay line 210 is approximately equal to the period of the input clock signal.

During the lock assist mode, instead of control circuit 250 modifying the delay of the delay line 210 based on the analog loop filter voltage, control circuit 250 modifies the delay of delay line 210 based on a signal from delay sense circuit 260 where the signal from delay sense circuit 260 indicates whether the delay of delay line 210 is less than or is greater than a threshold value.

In some embodiments, during the lock assist mode, control circuit 250 modifies the delay of delay line 210 by changing the analog loop filter voltage based on whether the signal from delay sense circuit 260 indicates that the delay of delay line 210 is less than or is greater than the threshold value.

In alternative embodiments, the delay line 210 is programmable, and the control circuit 250 programs the delay line 210. For example, each of the outputs of the delay stages of the delay line 210 may be connected to a programmable capacitive load, and, during the lock assist mode, control circuit 250 modifies the value of the programmable capacitive loads based on whether the signal from delay sense circuit 260 indicates that the delay of delay line 210 should be increased or decreased according to whether the delay of the delay line is less than or is greater than a threshold value. In alternative embodiments, alternative delay programming methods may be used. In embodiments using a programmable delay line 200, during the lock assist mode, while the delay line 210 is being programmed, control circuit 250 may cause the analog loop filter voltage of loop filter 240 to be equal to a voltage substantially in the middle of a functional range of the analog loop filter voltage use during normal operation, such as within about 10% of the middle of the functional range.

As discussed above, delay sense circuit 260 provides a signal indicating whether the delay of delay line 210 should be increased or decreased. In some embodiments, delay sense circuit 260 also provides a signal indicating whether the delay of delay line 210 is acceptable and should not be increased or decreased.

In some embodiments, delay sense circuit 260 comprises a resettable counter. For example, delay sense circuit 260 may comprise a counter which increments in response to receiving rising clock edges from the input clock in which is reset in response to receiving a rising edge from the output of delay line 210.

As understood by those of skill in the art, the desired condition that the delay of delay line 210 is approximately equal to the period of the input clock signal corresponds with the condition that two rising edges of the input clock occur for every one rising edge of the output of the delay line 210. Accordingly, in response to the counter having counted less than two rising edges of the input clock when being reset, the counter generates a signal for control circuit 250 indicating that the delay of delay line 210 should be increased. Additionally, in response to the counter having counted two or more rising edges of the input clock when being reset, the counter generates a signal for control circuit 250 indicating that the delay of delay line 210 should be decreased.

In some embodiments, control circuit 250 is configured to use the signals from delay sense circuit 260 with a linear search algorithm to determine that the delay of the delay line is approximately equal to the period of the input clock signal. In some embodiments, control circuit 250 is configured to use the signals from delay sense circuit 260 with a binary search algorithm to determine that the delay of the delay line is approximately equal to the period of the input clock signal.

Once the delay value of the delay line 210 is determined to be approximately equal to the period of the input clock signal, the DLL circuit 200 exits lock assist mode, and enters the normal operating mode, where the DLL feedback loop using the analog loop filter voltage is used to modify the output signal of the delay line 210 such that its phase and frequency are approximately equal to that of the input clock signal.

For example, the delay line stages may each include a current starved inverter, and the analog loop filter voltage may be used to control the current of the current starved inverters.

Because the DLL circuit 200 and enters normal operating mode after the delay value of the delay line 210 is approximately equal to the period of the input clock signal, the normal operating mode causes the DLL circuit 200 to properly lock, and therefore the DLL circuit 200 locks quickly, and is not subject to false locking.

Figure 3:
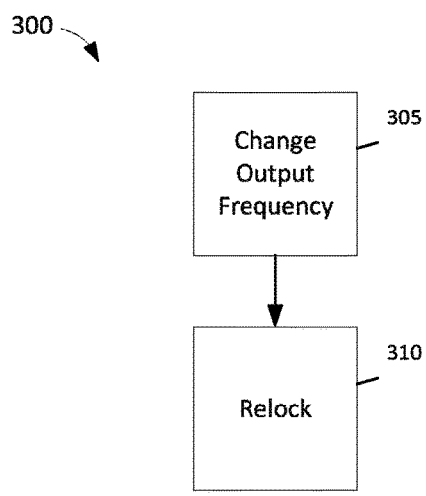
FIG. 3 is a flowchart diagram illustrating an embodiment of a method of operating an embodiment of a DLL circuit.

FIG. 3 is a flowchart diagram illustrating an embodiment of a method 300 of operating an embodiment of a DLL circuit. In the described embodiment, DLL circuit 200 having delay line 500, discussed below, as its delay line, performs the method. The method may be performed by other DLL circuits.

At 305, control circuit 250 changes the value of the signal at node or bus Freq Ctrl to cause DLL circuit 200 to change the frequency of the output clock at output node Xout. For example, while generating an output clock having a frequency seven times the frequency of the input clock, the control circuit 250 may change the value of the signal at node or bus Freq Ctrl to cause DLL circuit to change the frequency of the output clock to be five times the frequency of the input clock. Other frequency changes may be made.

The change in frequency of the desired output clock occurring at 305 may cause the DLL circuit 200 to loose lock. For example, the frequency of the delay line output clock changes because of the change in desired output frequency. To reacquire lock, at 310, the DLL circuit 200 operates in an unlocked state until lock is reacquired. In some embodiments, the control circuit 250 causes the DLL circuit to operate in a lock assist mode as part of reacquiring lock. For example, an embodiment of lock assist mode is discussed below with reference to FIG. 4.

Figure 4:
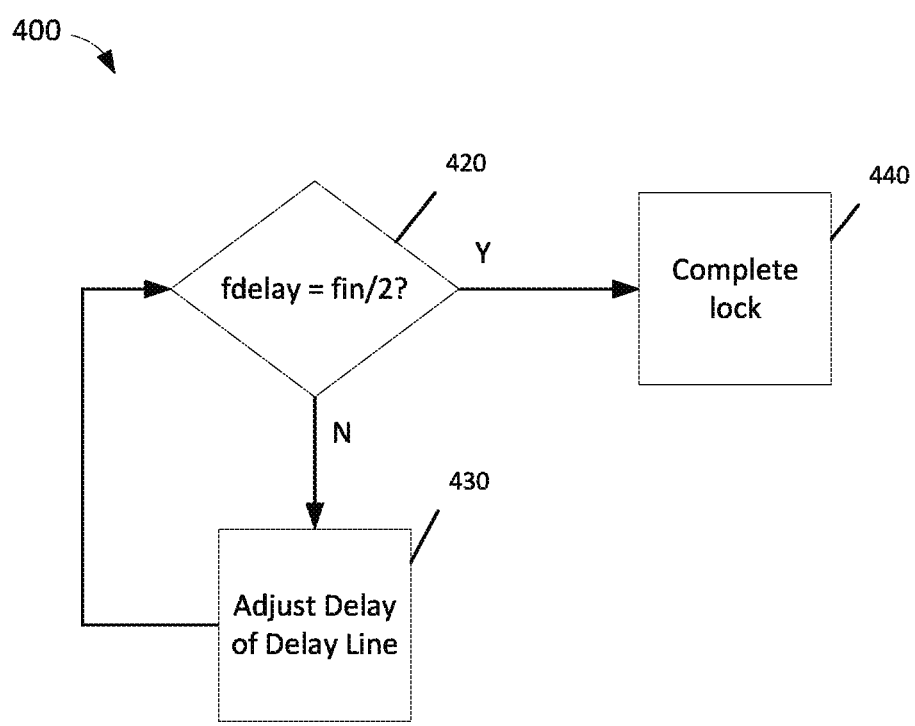
FIG. 4 is a flowchart diagram illustrating an embodiment of a method of operating an embodiment of a DLL circuit.

FIG. 4 is a flowchart diagram illustrating an embodiment of a method 400 of operating an embodiment of a DLL circuit. In the described embodiment, DLL circuit 200 having delay line 500, discussed below with reference to FIG. 5, as its delay line, performs the method. The method may be performed by other DLL circuits.

Control circuit 250 causes the DLL circuit 200 to operate in a lock assist mode. In some embodiments, the control circuit causes the DLL circuit to operate in lock assist mode as part of a process of changing output frequency of the DLL circuit 200. In some embodiments, the control circuit causes the DLL circuit to operate in lock assist mode in response to the at least one of the phase and frequency of the delay line 500 being different from the input clock by an amount greater than a threshold, which occurs as a result of the change in output frequency of the delay line 500, which occurs as a result of the control circuit 250 changing the value of the signal at node or bus Freq Ctrl.

The control circuit 250 causes the DLL circuit to operate in the lock assist mode at least by changing the state of the mode input signal at node Mode Ctrl so as to cause multiplexer 205 to pass an inverted version of the delay line output to the first delay stage D1. In some embodiments, the control circuit also powers down one or more of delay stage D6, delay stage D7, buffer B6, and buffer B7, as these elements are no longer needed. In addition, in some embodiments, the control circuit 250 causes the DLL circuit 200 to operate in the lock assist mode at least by causing the analog loop filter voltage of loop filter 240 to be equal to a voltage substantially in the middle of a functional range of the analog loop filter voltage use during normal operation. In addition, in some embodiments, the control circuit 250 causes the DLL circuit 200 to operate in the lock assist mode at least by performing a method of causing the delay of delay line 500 to become approximately equal to the period of the input clock signal by modifying the capacitance of programmable capacitors C1-C5 according to a linear or binary search algorithm, as described elsewhere herein.

At 420, control circuit 250 determines whether the at least one of the phase and frequency of the delay line output is different from the input clock by an amount less than a threshold. For example, the control circuit 250 may determine whether the at least one of the phase and frequency of the delay line output is different from the input clock by an amount less than a threshold based on signals from delay sense circuit 260, as discussed elsewhere herein.

In response to control circuit 250 determining that the at least one of the phase and frequency of the delay line output is different from the input clock by an amount greater than the threshold, the control circuit 250 determines whether the delay of the delay line should be increased or decreased, and the method proceeds to 430, where control circuit 250 increases or decreases the delay of the delay line.

Control circuit 250 may increase or decrease the delay of the delay line, for example, by changing a programming state of a programmable feature of the delay stages of the delay line. For example, as discussed elsewhere, control circuit 250 may increase or decrease the delay of the delay line by changing the capacitance values of programmable capacitors C1-C5 of delay line 500. As understood by those of skill in the art, increasing the capacitance values of the programmable capacitors C1-C5 increases the delay of the delay line, and decreasing the capacitance values of the programmable capacitors C1-C5 decreases the delay of the delay line.

Once the delay of the delay line is increased or decreased, the method returns to 420.

In response to control circuit 250 determining that the at least one of the phase and frequency of the delay line output is not different from the input clock by an amount greater than the threshold being used, the control circuit 250 causes the DLL circuit 200 to operate in a normal operating mode at 440.

The control circuit 250 causes the DLL circuit to operate in the normal operating mode at least by changing the state of the mode input signal at node Mode Ctrl so as to cause multiplexer 205 to pass the input clock at Vin to the first delay stage D1. In some embodiments, the control circuit 250 causes the DLL circuit 200 to operate in the normal operating mode at least by causing the analog loop filter voltage of loop filter 240 to be modified by charge pump circuit 230.

In addition, in some embodiments, the control circuit 250 causes the DLL circuit 200 to operate in the normal operating mode by modifying delay of the delay stages D1-D5 of the delay line 500 by repeatedly modifying the delay line output such that its phase and frequency become approximately equal to that of the input clock signal. For example, the delay line stages may each include a current starved inverter, and the analog loop filter voltage may be used to control the current of the current starved inverters.

In normal operating mode, the DLL circuit 200 acquires lock by modifying the analog loop filter voltage of loop filter 240 with the PFD 220, charge pump 230, and loop filter 240 until lock is acquired. Thereafter, the DLL circuit 200 maintains lock by modifying the analog loop filter voltage of loop filter 240 according to the feedback loop formed at least partly by delay line 210, PFD 220, charge pump 230, and loop filter 240.

Figure 5:
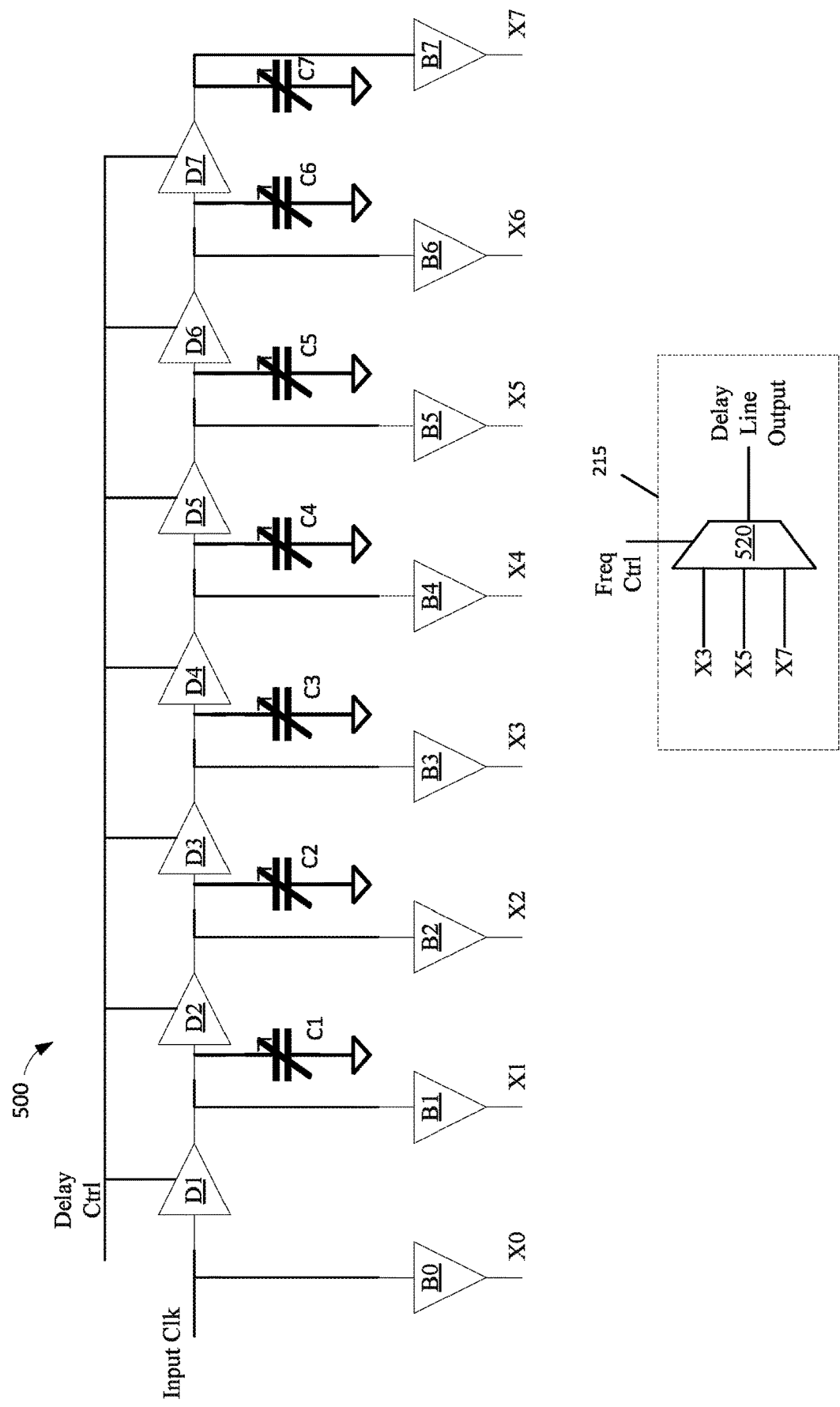
FIG. 5 a schematic illustration of a delay line.

FIG. 5 a schematic illustration of a delay line 500, which may be used as delay line 210 in DLL circuit 200 of FIG. 2. For convenience, multiplexor 215 of DLL circuit 200 is also illustrated. Multiplexor 215 is configured to have a programmable output frequency. Other embodiments of delay lines may be used as delay line 210 in DLL circuit 200 of FIG. 2.

As shown, delay line 500 includes delay stages, D1-D7, programmable capacitors C1-C7, buffers B1-B7, and multiplexer 520.

The multiplexer 205 of FIG. 2 is configured to pass an inverted version of the selected delay line output at node Delay Line Output or to pass oscillator input at input node Vin to the first delay stage D1 according to a signal at mode input at node Mode Ctrl from controller 250. While in lock assist mode, multiplexer 205 is configured to pass the inverted version of the selected delay line output to the first delay stage D1. While in normal operation mode, multiplexer 205 is configured to pass oscillator input at input node Vin to the first delay stage D1.

Delay stages D1-D7 may comprise any controllable delay stage, as known in the art. For example, each of delay stages D1-D7 may include one or more current starved inverters, as known in the art. During normal operation, the control circuit modifies a signal at node Delay Ctrl based on the analog loop filter voltage. In some embodiments, the voltage at node Delay Ctrl is equal to the analog loop filter voltage. In some embodiments, the voltage at node Delay Ctrl is based on the analog loop filter voltage. The propagation delay time of each of the delay stages D1-D7 is modified according to the signal at node Delay Ctrl.

As illustrated, each of delay stages D1-D7 drives a corresponding one of programmable capacitors C1-C7. During lock assist mode, the control circuit uses a search algorithm (e.g. binary or linear) to determine that the delay of the delay line by modifying the capacitance of the programmable capacitors C1-C7, as discussed elsewhere herein.

Buffers B0-B7 generate corresponding clock signals X0-X7, as understood by those of skill in the art.

Multiplexer 215 is configured to pass one of clock signals X3, X5, and X7 as the output of the delay line at output node Delay Line Output. In other embodiments, different clock signals and/or a different number of clock signals may be selected as the output of the delay line at output node Delay Line Output. Which of clock signals X3, X5, and X7 is passed is the output of the delay line is determined according to the signal at node or bus Freq Ctrl. The signal at node or bus Freq Ctrl is determined by the control circuit 250.

In some embodiments, when operated in certain frequency modes, delay stages and/or buffers which are not used may be powered down. For example, if the clock signal X3 is passed as the delay line output, delay stages D4-D7 and/or buffers B4-B7 may be turned off by the control circuit, for example, to save power and/or noise.

If used as delay line 210 in DLL circuit 200 of FIG. 2, when DLL circuit 200 is operated in the lock assist mode, the output of the delay line at output node Delay Line Output is used to generate the delay line input clock at node Input Clk of FIG. 2.

Figure 6:
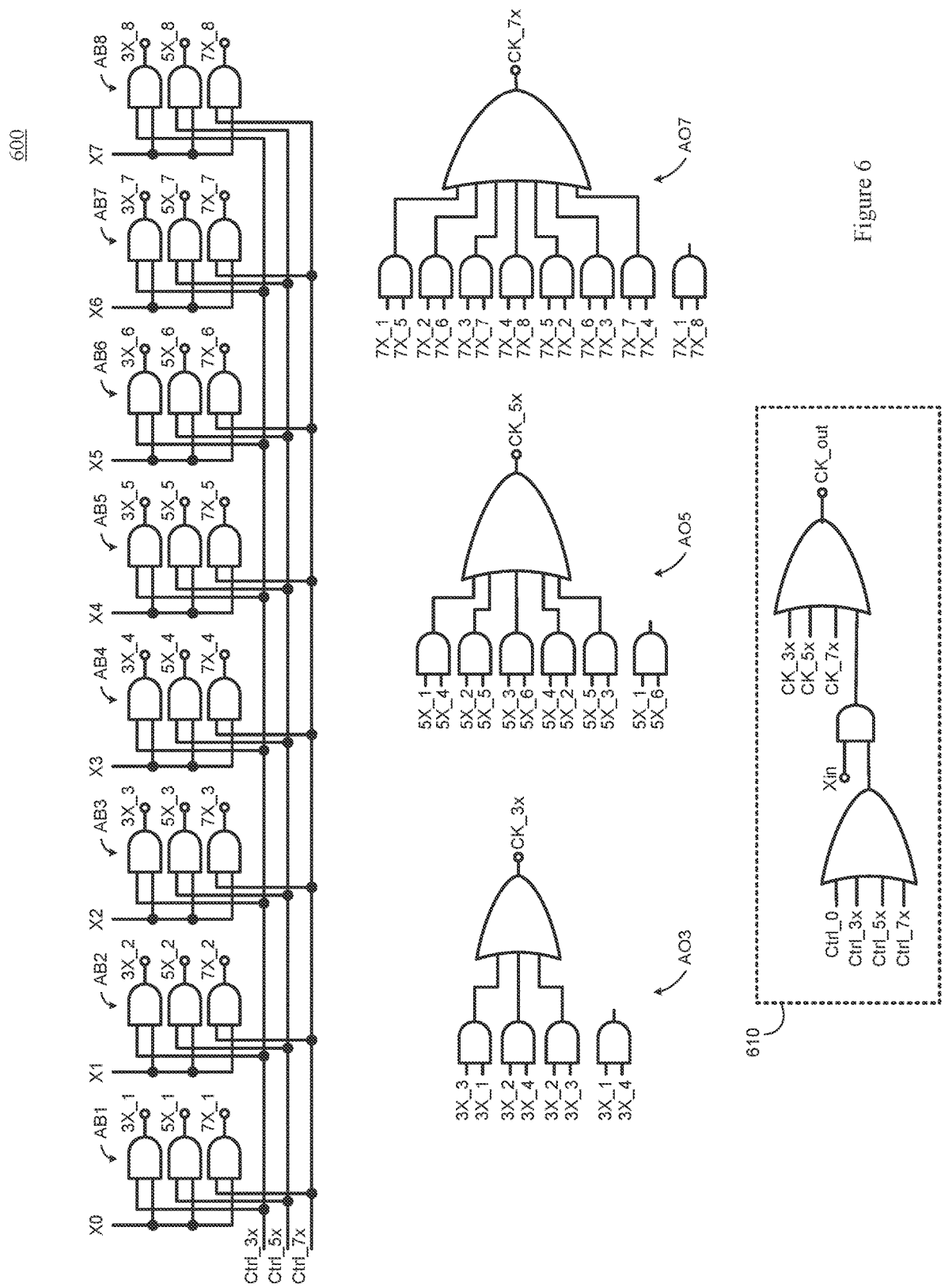
FIG. 6 is a schematic illustration of an embodiment of an edge combiner circuit.

FIG. 6 is a schematic illustration of an embodiment of an edge combiner circuit 600. Edge combiner circuit 600 may be used, for example, as the edge combiner circuit 270 of DLL circuit 200 of FIG. 2, where delay line 500 of FIG. 5 is used as the delay line 210 of DLL circuit 200 of FIG. 2. Other edge combiner circuits having features similar or identical to edge combiner circuit 600, as understood by those of skill in the art, may be used in DLL circuit 200.

Edge combiner circuit 600 receives delay line clock signals X0-X7 from delay line 500, and generates an output signal at output node CK_Out based on the received delay line clock signals. Edge combiner circuit 600 also receives frequency control signals Ctrl_0, Ctrl_3x, Ctrl_5x, and Ctrl_7x from control circuit 250, and generates the appropriate output signal based on the received frequency control signals.

As shown, each of delay line clock signals X0-X7 is received by a corresponding one AND gate bank of AND gate banks AB1-AB8, where each of AND gate banks AB1-AB8 includes one, two, or three AND gates. As shown, each of the AND gates of each AND gate bank AB[1-8] receives a corresponding clock signal X[0-7]. In addition, each of the AND gates of each AND gate bank AB[1-8] receives one of the frequency control signals Ctrl_3x, Ctrl_5x, and Ctrl_7x.

In this embodiment, at most one of the frequency control signals Ctrl_3x, Ctrl_5x, and Ctrl_7x is high, and at least two of the frequency control signals Ctrl_3x, Ctrl_5x, and Ctrl_7x are low. Accordingly, at least two of the outputs of each of the AND gate banks AB1-AB8 are fixed low, and, if one of the frequency control signals Ctrl_3x, Ctrl_5x, and Ctrl_7x is high, the AND gate receiving the high frequency control signal generates an output corresponding with its received clock signal X[0-7].

When all of the frequency control signals Ctrl_3x, Ctrl_5x, and Ctrl_7x are low, all of the outputs of the AND gate banks AB1-AB8 are fixed low.

As illustrated in FIG. 6, AND OR circuit AO7 receives the 7X outputs of AND gate banks AB1-AB8, AND OR circuit AO5 receives the 5X outputs of AND gate banks AB1-AB6, AND OR circuit AO3 receives the 3X outputs of AND gate banks AB1-AB4.

The control circuit 250 causes frequency control signal Ctrl_7x to be high, for example, when output frequency of the output clock of DLL circuit 200 is to be seven times the frequency of the input clock.

In response to the control circuit 250 causing frequency control signal Ctrl_7x to be high, the 7X outputs of AND gate banks AB1-AB8 respectively correspond with delay line clock signals X0-X7. AND OR circuit AO7 receives the 7X outputs of AND gate banks AB1-AB8, and generates a clock signal at node CK_7x according to the logic illustrated in the schematic.

In response to frequency control signals Ctrl_3x and Ctrl_5x being low while frequency control signal Ctrl_7x is high, the 3X and 5X outputs of AND gate banks AB1-AB6 are low. Accordingly, AND OR circuits AO3 and AO5 receives only low signal inputs, and therefore respectively generate fixed low clock signals at nodes CK_3x and CK_5x.

The control circuit 250 causes frequency control signal Ctrl_5x to be high, for example, when output frequency of the output clock of DLL circuit 200 is to be five times the frequency of the input clock.

In response to the control circuit 250 causing frequency control signal Ctrl_5x to be high, the 5X outputs of AND gate banks AB1-AB6 respectively correspond with delay line clock signals X0-X5. AND OR circuit AO5 receives the 5X outputs of AND gate banks AB1-AB6, and generates a clock signal at node CK_5x according to the logic illustrated in the schematic.

In this embodiment, the control circuit 250 causes delay line 500 to force delay line clock signals X6 and X7 to be low.

In response to frequency control signals Ctrl_3x and Ctrl_7x being low while frequency control signal Ctrl_5x is high, the 3X and 7X outputs of AND gate banks AB1-AB8 are low. Accordingly, AND OR circuits AO3 and AO7 receives only low signal inputs, and therefore respectively generate fixed low clock signals at nodes CK_3x and CK_7x.

The control circuit 250 causes frequency control signal Ctrl_3x to be high, for example, when output frequency of the output clock of DLL circuit 200 is to be three times the frequency of the input clock.

In response to the control circuit 250 causing frequency control signal Ctrl_3x to be high, the 3X outputs of AND gate banks AB1-AB4 respectively correspond with delay line clock signals X0-X3. AND OR circuit AO3 receives the 3X outputs of AND gate banks AB1-AB4, and generates a clock signal at node CK_3x according to the logic illustrated in the schematic.

In this embodiment, the control circuit 250 causes delay line 500 to force delay line clock signals X4-X7 to be low.

In response to frequency control signals Ctrl_5x and Ctrl_7x being low while frequency control signal Ctrl_3x is high, the 5X and 7X outputs of AND gate banks AB1-AB8 are low. Accordingly, AND OR circuits AO5 and AO7 receives only low signal inputs, and therefore respectively generate fixed low clock signals at nodes CK_5x and CK_7x.

Output stage 610 receives the clock signals at nodes CK_3x, CK_5x, and CK_7x, frequency control signals Ctrl_0, Ctrl_3x, Ctrl_5x, and Ctrl_7x, and a clock signal at node Xin which is identical or substantially identical to the input clock at input node Vin.

In accordance with the logic of the illustrated schematic, if any of frequency control signals Ctrl_3x, Ctrl_5x, and Ctrl_7x are high, the output stage 610 generates an output signal at output node CK_Out according to the clock signal at the one of nodes CK_3x, CK_5x, and CK_7x corresponding with the high control signal.

In addition, if frequency control signal Ctrl_0 is high, the output stage 610 generates a fixed low as the output signal at output node CK_Out.

Furthermore, if all of frequency control signals Ctrl_0, Ctrl_3x, Ctrl_5x, and Ctrl_7x are low, the output stage 610 generates an output signal at output node CK_Out according to the clock signal at node Xin.

Though the present invention is disclosed by way of specific embodiments as described above, those embodiments are not intended to limit the present invention. Based on the methods and the technical aspects disclosed herein, variations and changes may be made to the presented embodiments by those of skill in the art without departing from the spirit and the scope of the present invention.

What is claimed is:

1. A DLL circuit, comprising:
an input configured to receive an input clock defining an input clock period;
an output configured to provide a DLL output clock;
a delay line configured to receive the input clock, wherein the delay line comprises a plurality of delay stages, each delay stage configured to generate a respective one of a plurality of delay line output clocks to have a phase relative to the input clock based on a respective delay associated with the delay stage; and
an edge combiner circuit configured to generate the DLL output clock responsive to a frequency control signal that indicates a selected one of a plurality of frequency modes, such that the DLL output clock has a first DLL clock period in a first of the plurality of frequency modes generated based on a first logical combination of the delay line output clocks, and the DLL output clock has a second DLL clock period in a second of the plurality of frequency modes generated based on a second logical combination of the delay line output clocks.

2. The DLL circuit of claim 1, further comprising:
a control circuit configured to change the respective delays associated with the delay stages of the delay line so as to cause a phase difference between the input clock and a sensed delay line output clock to be substantially equal to the period of the input clock.

3. The DLL circuit of claim 2, wherein the control circuit is configured to change which of the delay line output clocks is sensed based on the frequency control signal.

4. The DLL circuit of claim 2, wherein the sensed delay line output clock is a divided version of another delay line output clock.

5. The DLL circuit of claim 2, wherein the edge combiner circuit is configured to generate the DLL output clock based on the input clock, the sensed delay line output clock, and any other delay line output clocks having phase differences relative to the input clock which are less than the sensed delay line output clock.

6. The DLL circuit of claim 5, wherein the delay line comprises N delay stages generating N delay line output clocks, wherein N is an integer, wherein a first delay stage through an Nth delay stage are sequentially connected in series, and wherein the control circuit is configured to select any of the Nth delay line output clock and at least one other delay line output clock as the sensed delay line output clock.

7. The DLL circuit of claim 6, wherein the control circuit is configured to select a particular delay line output clock as the sensed delay line output clock and to power down delay stages generating outputs clocks having phase differences relative to the input clock which are greater than a phase difference relative to the input clock of the selected particular delay line output clock.

8. A DLL circuit, comprising:
an input configured to receive an input clock defining an input clock period;
an output configured to provide a DLL output clock;
a delay line configured to receive the input clock, wherein the delay line comprises a plurality of delay stages, each delay stage configured to generate a respective one of a plurality of delay line output clocks to have a phase relative to the input clock based on a respective delay associated with the delay stage;
an edge combiner circuit configured to generate the DLL output clock based on a subset of the delay line output clocks selected based on a frequency mode as indicated by a frequency control signal; and
a control circuit configured to change the respective delays associated with the delay stages of the delay line so as to cause a phase difference between the input clock and a sensed delay line output clock to be substantially equal to the input clock period,
wherein the sensed delay line output clock is generated from at least one of the delay line output clocks selected based on the frequency control signal.

9. The DLL circuit of claim 8, wherein the sensed delay line output clock is a divided version of another delay line output clock.

10. The DLL circuit of claim 8, wherein the delay line comprises N delay stages generating N delay line output clocks, wherein N is an integer, wherein a first delay stage through an Nth delay stage are sequentially connected in series, and wherein the control circuit is configured to select any of the Nth delay line output clock and at least one other delay line output clock as the sensed delay line output clock.

11. The DLL circuit of claim 8, wherein the control circuit is configured to select a particular delay line output clock as the sensed delay line output clock and to power down delay stages generating outputs clocks having phase differences relative to the input clock which are greater than a phase difference relative to the input clock of the selected delay line output clock.

12. The DLL circuit of claim 8, wherein the edge combiner circuit is configured to generate the DLL output clock based on the input clock, the sensed delay line output clock, and any other delay line output clocks having phase differences relative to the input clock which are less than a phase difference relative to the input clock of the sensed delay line output clock.

13. A DLL circuit, comprising:
an input configured to receive an input clock defining an input clock period;
an output configured to provide a DLL output clock;
no more than one delay line configured to receive the input clock, wherein the delay line comprises a plurality of delay stages, each delay stage configured to generate a respective one of a plurality of delay line output clocks to have a phase relative to the input clock based on a respective delay associated with the delay stage;

an edge combiner circuit configured to generate the DLL output clock based on a plurality of the delay line output clocks selected based on a frequency control signal; and a control circuit configured to:

change the delay of the delay line so as to cause a phase difference between the input clock and a sensed one of the output clocks to be substantially equal to the period of the input clock, wherein the control circuit is configured to change a frequency of the DLL output clock.

14. The DLL circuit of claim 13, wherein the control circuit is configured to change which of the delay line output clocks is sensed.

15. The DLL circuit of claim 13, wherein the control circuit is configured to change which of the delay line output clocks the edge combiner circuit uses to generate the DLL output clock by changing the frequency control signal.

16. The DLL circuit of claim 13, wherein the control circuit is further configured to control a mode of the delay line, so that the input clock is based on a reference clock signal in a first mode, and the input clock is based on the sensed one of the output clocks in a second mode.

* * * * *